United States Patent [19]

Goertzel et al.

[11] Patent Number: 4,633,490
[45] Date of Patent: Dec. 30, 1986

[54] SYMMETRICAL OPTIMIZED ADAPTIVE DATA COMPRESSION/TRANSFER/DECOMPRESSION SYSTEM

[75] Inventors: Gerald Goertzel, White Plains; Joan L. Mitchell, Ossining, both of N.Y.

[73] Assignee: International Business Machines Corporation, Armonk, N.Y.

[21] Appl. No.: 589,981

[22] Filed: Mar. 15, 1984

[51] Int. Cl.$^4$ .............................................. H04B 1/66
[52] U.S. Cl. ................................. 375/122; 358/135; 358/260
[58] Field of Search .................. 375/122, 27; 358/135, 358/136, 260, 261; 381/31

[56] References Cited

U.S. PATENT DOCUMENTS

| | | | |
|---|---|---|---|
| T928,003 | 11/1974 | Bahl et al. | 358/135 |
| 3,824,590 | 7/1974 | Limb | 358/135 |
| 4,093,962 | 6/1978 | Ishiguro et al. | 358/135 |
| 4,470,072 | 9/1984 | Tanaka et al. | 358/135 |

Primary Examiner—Douglas W. Olms
Assistant Examiner—Wellington Chin
Attorney, Agent, or Firm—Carl C. Kling

[57] ABSTRACT

Data compression for transfer (storage or communication) by a continuously adaptive probability decision model, closely approaches the compression entropy limit. Sender and receiver perform symmetrical compression/decompression of binary decision n according to probabilities calculated independently from the transfer sequence of 1 ... n−1 binary decisions. Sender and receiver dynamically adapt the model probabilities, as a cumulative function of previously presented decisions, for optimal compression/decompression. Adaptive models for sender and receiver are symmetrical, to preserve data identity; transfer optimization is the intent. The source model includes a state generator and an adaptive probability generator, which dynamically modify the coding of decisions according to state, probability and bit signals, and adapt for the next decision. The system calculates probability history for all decisions, including the current decision, but uses probability history for decision n−1 (the penultimately current decision) for encoding decision n (the dynamically current decision). The system, separately at source and destination, reconfigures the compression/expansion algorithm, up to decision n−1, codes each decision in the data stream optimally, according to its own character in relation to the calculated probability history, and dynamically optimizes the current decision according to the transfer optimum of the data stream previously transferred. The receiver operates symmetrically to the sender. Sender and receiver adapt identically, and adapt to the same decision sequence, so that their dynamically reconfigured compression-expansion algorithms remain symmetrical—even though the actual algorithms may change with each decision as a function of dynamic changes in probability history.

17 Claims, 13 Drawing Figures

FIG. 2  Coding the $n$'th Event

Initialize State = 0 Statistics

CT ← 0
N ← 7
D ← N + 1
IP ← IPST + D + D
P ← N * ID

Initialize State ≠ 0 Statistics

N ← 1
P ← X'3FFF'
IP ← IPST + 4

Initialize Variables

IPST ← ADDR INVERT
IE ← IPST + 254
BP ← BPST
BP ← BP − 1
BE ← BP + LEN

| Coder Only | Decoder Only |
|---|---|
| F ← 0 | BYTEIN |
| R ← X'7FFF' | BYTEIN |
|  | R ← X'7FFF' |

FIG. 12   Initialization

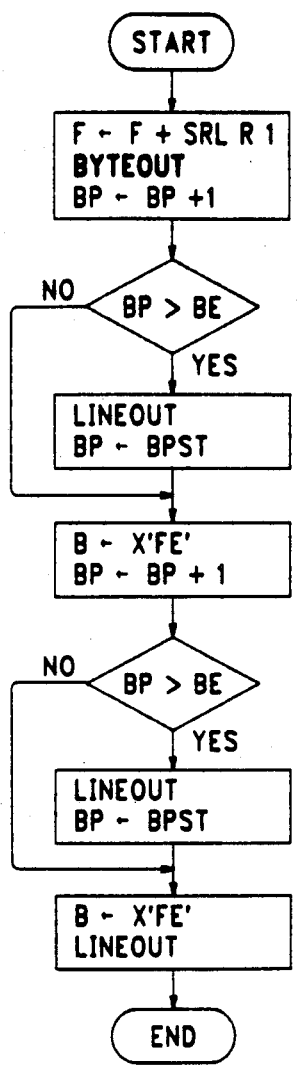
FIG. 13  Output final bytes

SYMMETRICAL OPTIMIZED ADAPTIVE DATA COMPRESSION/TRANSFER/DECOMPRESSION SYSTEM

BACKGROUND OF THE INVENTION

Field of the Invention

This invention relates to data compression/transfer/decompression systems, and more particularly relates to a symmetrical adaptive data compression/transfer/decompression system where both sender and receiver dynamically with respect to the data stream carry out adaptive prediction calculation regimens, presenting for binary decision symmetrical sequences of predictions representing data streams at source and destination, calculating compression/decompression decision predictions separately but symmetrically at source and destination for binary decisions 1 ... n according to cumulative prediction history which is for each decision optimized respectively for decisions 0 ... n−1.

The system operates by adaptively coding the binary decisions rather than being forced to send a bit. Since the statistics used for the coding of the nth decision are part of the adaption process carried out symmetrically by the source model and destination model updated to the n-1th decision, optimal coding for the model selected is achieved without constraint as to the type of data transferred or the model selected.

All information transferred according to this invention is compressed for transfer, without requiring the overhead of transferring any probability information, because predicted probabilities are calculated symmetrically at source and destination, using adaptive techniques.

For reasons of speed, it is advantageous in some circumstances to delay updating of the probability information. This delay is useful for processing an event which occurs many times in succession; since updating a counter is cheaper than the multiplication required to update the probability, the coder operates more rapidly.

The length of the total compressed data stream approaches the entropy predictions, even with relatively small data processors, such as those operating with 16 bit precision.

CITATION OF REFERENCES

1. U.S. Pat. No. 4,369,463, Dimitris Anastassiou and Joan L. Mitchell, GRAY SCALE IMAGE DATA COMPRESSION WITH CODE WORDS A FUNCTION OF IMAGE HISTORY, Jan. 18, 1983, describes an adaptive data compression system where data compression information, in the form of "Code OK" or "Code Not OK" (0 or 1) dynamically defines the definition information for prediction.
2. J. Rissanen and G. G. Langdon, "Universal Modeling and Coding," IEEE Trans Info Theory, vol IT-27, No. 1, 12 (1981).
3. G. G. Langdon and J. Rissanen, "A Simple General Binary Source Code," IEEE Trans Info Theory, vol IT-28, No 5, 800 (1982).
4. F. Rubin, "Arithmetic Stream Coding Using Fixed Precision Registers," IEEE Trans Info Theory, vol IT-25, No 6, 672 (1979).
5. G. N. Martin, "Range Encoding: an Algorithm for Removing Redundancy from a Digitized Message," Presented at the Video and Data Recording Conference, Southampton, July 1979.
6. G. G. Langdon and J. Rissanen, "Compression of Black-White Images with Arithmetic Coding," IEEE Trans. Comm. vol COM-29, No. 6, 858 (June 1981).
7. J. Rissanen, "Arithmetic Coding of Strings," IBM Research Report RJ1591, June 1975.
8. J. Rissanen and G. G. Langdon, "Arithmetic Coding," IBM J Res. Dev., Vol 23, No 2, 149 (1979).
9. G. G. Langdon, "Tutorial on Arithmetic Coding," IBM Research Report RJ3128, May 1981.
10. D. Anastassiou et al., "Series/1 based videoconferencing system," IBM Systems Journal Vol. 22, Nos. ½, pp. 97–110, 1983.
11. G. Nigel N. Martin et al, "Arithmetic Codes for Constrained Channels", IBM Journal of R & D, Vol. 27, No. 2, pp. 94–106, March 1983.

DESCRIPTION OF THE PRIOR ART AND COMPRESSION/DECOMPRESSION THEORY

The prior art discloses a wealth of knowledge of data compression, starting with the coded grunts of prehistoric language, and continuing through the single dot Morse code e to sophisticated prediction-based run-length codes of modern data transmission. There is a significant knowledge base of data compression, including practical systems which operate well when the statistics of the data stream are known, such as Morse Code for the English language (agreed models hard-wired at source and destination optimized for an agreed language.)

Data compression/decompression according to a model is known. The model prescribes a prediction mode for a current data group. Prediction may provide very great data compression—for example, the first bit of a message may be a response to an agreed query whether to continue in a standard code or change to a cipher. The amount of information contained in the single bit in such circumstance is very great. Complex prediction models, depending upon the likelihood of continuation of similar data, are known. In images, for example, large smooth areas of white space may be identified by only a few bits, defining the agreement with predicted continuation of white space and the count of such agreements. Upon detection of an edge, where white and black meet, there normally is a need for a greater number of bits to predict the possible situations and a greater number of bits to accept the proper predictions. This prediction mode requires agreement at source and destination, so that the compressed source data can be properly decompressed at the destination. There are a number of data compression and data decompression models disclosed in the prior art.

So long as source and destination code selection models are properly matched, data compression at source and data decompression at destination may continue. Morse code source and Morse code destination agree that the dot is the letter "e." For large amounts of data, with a variety of characteristics, unchanging code selection is not optimal. It helps greatly to alter the code from time to time to make a code selection optimized to predict the next data group according to the accumulated knowledge of data history. Such code selection may be dynamically changed for each data group transferred, but frequent code selection changes may require a significant amount of data transfer to warn the destination that the source is changing code. In some prediction codes, prediction precision (the number of bits required to select from among the predicted values), known as the mode, is periodically transferred.

Rubin <4> describes the arithmetic stream coding process using fixed precision registers. Rubin (as well as all of the implementations in Refs 2-10, which worry about the necessity of finite precision for practical embodiments) adjusts the significant bits in the finite precision registers one bit at a time. This keeps the maximum precision, but is time consuming in computers.

This prior art provides some understanding of how to adapt a compression technique to the texture of the data in the stream, but the prior art does not teach nor suggest the symmetrical adaptive compression system of this invention.

SUMMARY OF THE INVENTION

It is the object of the invention to approach optimal compression by continuously adapting the compression/decompression system to the dynamic history of the data in the data stream, and to implement this continuously adapted compression/decompression system practically, through symmetrical adaptive compression/expansion and mode zero.

A more specific object of the invention is to compress/decompress data transfers over time or distance by transferring compressed data, without any overhead of accompanying prediction calculations, deriving model prediction calculations, symmetrically and adaptively, synchronously at source and destination, with the result that all information transferred is compressed together according to the compression model update accurate up to data group $n-1$ for compression of data group n.

A feature of the invention is the separate handling of prediction information during sequences where prediction smoothness (such as continuous white space at the margin of a letter) permits prediction mode inferences to be made, and transferred as a repetition count, at a significant increase in compression, rather than requiring actual transfer of data on a dynamic basis.

Another feature of the invention is the simple handling of prediction sequences by shifting (a binary multiply *2 or binary divide *2), which avoids the time-consuming multiply operation and the extremely time-consuming divide operation.

An advantage of the invention is that it provides data compression capability, even for a relatively small data processor, approaching the entropy limit. This permits transfer of relatively enormous volumes of data, with recovery at a reasonable level of precision, and permits transfer of large volumes of data with total precision.

The foregoing and other objects, features and advantages of the invention will be apparent from the more particular description of the preferred embodiments of the invention, as illustrated in the accompanying drawings.

BRIEF DESCRIPTION OF THE DRAWINGS

FIGS. 7-13 are detail flowcharts illustrating details implementing statements shown in boldface in the higher level flowcharts of FIGS. 4-6.

FIG. 7 is a flowchart of CALCP0, which updates statistics when Bit=0.

FIG. 8 is a flowchart of CALCP1, which updates statistics when Bit=1.

FIG. 9 is a flowchart of CALCPCT, which updates statistics for multiple coding steps when BIT=1.

FIG. 10 is a flowchart of BYTEOUT, which adds a unit of data to the compressed data stream.

FIG. 11 is a flowchart of BYTEIN, which moves a unit of data from the compressed data stream.

FIG. 12 is a chart of initialization for encoder and decoder.

FIG. 13 is a flowchart of an output final byte routine useful to guarantee that the decoder has enough data.

Because the subject matter of data compression is complex, and because the prior art must be well understood to understand the inventive departure, FIGS. 2-3 are used simply to explain the theory. FIG. 1 is a system diagram illustrating the invention. FIGS. 4-6 are intermediate level flowcharts illustrating the preferred embodiment. FIGS. 7-11 are detail flowcharts illustrating details of short sequences which are invoked in earlier figures. FIGS. 12 and 13 show initialization and termination.

Figure 1:
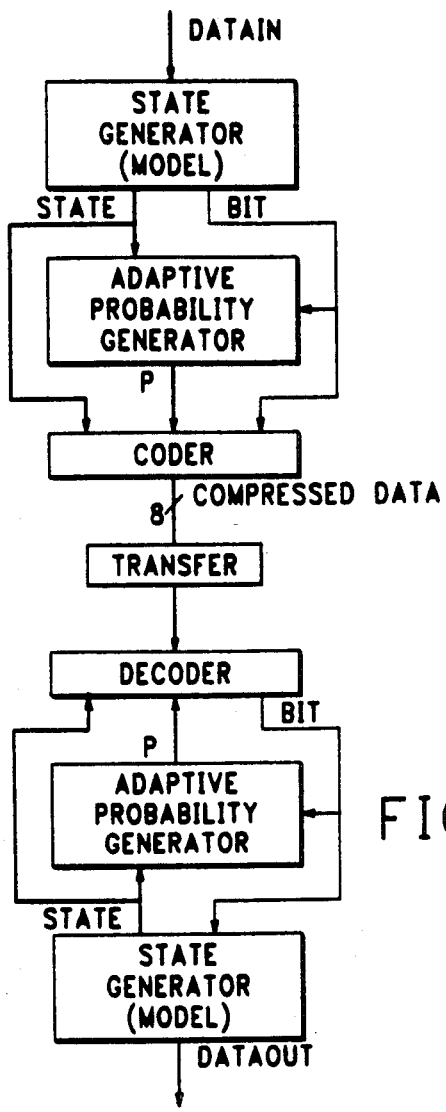
FIG. 1 is a functional block diagram of a symmetrical adaptive data compression/transfer/decompression system according to the invention.

In the drawings, which generally are flowcharts for computer programming, certain statements are shown in bold type to indicate that details of the statement are depicted in later drawings. Because of the nature of implementation of an invention by programming of a computer, identical statements normally are implemented by identical program sequences, although flexibility allows for different program sequences to accomplish the same function.

DESCRIPTION OF A PREFERRED EMBODIMENT OF THE INVENTION

This invention relates to a system in which binary bits are coded according to the current estimated probability from a selected model; the system operates independent of model selection so long as the source model and destination model are the same.

Symmetrical model prediction generators at source and destination operate synchronously on the same data stream, a sequence of data groups $(1 \ldots n-1, n)$, with transfer compressed according to probability adaptively optimized for data groups $1 \ldots n-1$. The current data group n is compressed for transfer from the source to the destination. The same sequence of data groups $(1 \ldots n-1, n)$ is presented to both source and destination (destination sees data groups compacted). Both source and destination symmetrically adapt to the probabilities optimized for the presented sequence, according to the same model using the same data history. Actual state changes are defined by mode definitions separately calculated at source and destination. This investment in separate symmetrical adaptive mode calculation capability pays off in its provision of greater compression of transfer data, a profitable investment considering the great cost of transferring data, particularly image data requiring megabytes. Transfer cost may transcend financial cost in situations where the transfer capability is limited in speed or capacity; this investment in separate symmetrical adaptive mode calculation capability may make possible certain transfers previously beyond the capacity of the transfer system.

The invention is embodied as a practical adaptive coding and decoding programming system, designed for implementation on small machines such as the IBM S/1 or PC or functional equivalents characteristically operating on sixteen bits (two bytes) of data in parallel. Unlike all of the implementations in Refs 2-10, the shifting of the code stream bits is done not one bit at a time, but rather in units of 8 bits, equivalent to a byte as regards processing arithmetic. This leads to a much faster implementation in software. The handling of the carry or overflow problem arising from the finite precision arithmetic is also only necessary when bytes are shifted out. The details of the probability calculation are included because their format is an integral part of coder/decoder and must be handled carefully. This programming system is useful for gray scale data compression. It is also useful in a teleconferencing system. The usefulness is enhanced ability to transfer data which normally would saturate the capability of the processor or of the communication transfer channel if uncompressed or if compressed by prior art techniques.

The coding scheme is described for 16 bit precision in detail. The extension to 32 bit precision is indicated.

The programming system is described in FIGS. 1-13. FIG. 1 is a functional block diagram of the compression/decompression system. The input DATAIN is converted into a sequence of binary decisions (represented by BIT) by the state generator according to a user-supplied model. For each binary decision the state generator also supplies a unique STATE to both the adaptive probability generator and the coder. The adaptive probability generator uses this state to determine the probability P that BIT will be zero. The coder uses this information along with the value of BIT to generate a compressed data stream. In the example shown this stream is sent out in eight-bit units. Conceptually the unit may be of any size which is compatible with the precision of the coding operations. Eight bits is particularly suited to encoding systems implemented on sixteen-bit machines. Sixteen-bit units for the compressed data works well for 32-bit machines.

The compressed data stream is optimally coded so that it may normally be transferred stored and/or transmitted at lower cost than the original data). A symmetric decoder is equipped with the corresponding state generator and identical adaptive probability generator. From the compressed data which is input into the decoder in units of eight bits (or the same data group used in the coder), the value of BIT is determined and used to generate DATAOUT. After the probability P has been generated the value of BIT is used to update the value of P which will be supplied for that state the next time it occurs. The probabilities generated in the two adaptive probability generators are kept in step because the updating does not occur until after the probability is supplied to the coder or decoder.

Figure 2:
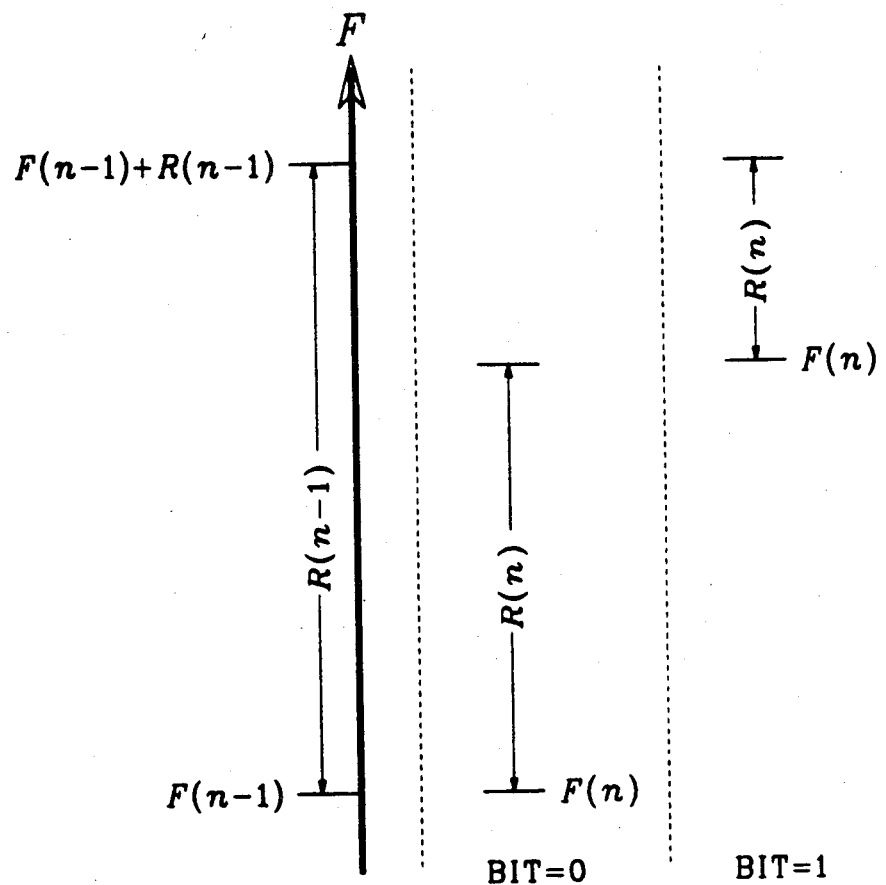
FIG. 2 is a diagram illustrative of data compression/decompression theory.

The code stream may be thought of as representing a real number which lies within an interval on the number line whose size is the product of the probabilities of all of the BITs coded. The length of the code stream is sufficient to uniquely identify the sequence of BITs. FIG. 2 illustrates the coding of a single BIT. Before the n'th BIT is coded, the code stream identifies a real number $F(n-1)$ which describes the events previously coded. $F(n-1)$ is the lower bound of the interval within which the number represented by the completed code stream will lie; the size of this interval is the product of the probabilities of the previously coded events and is referred to as the range $R(n-1)$. To code the n'th BIT, the range $R(n-1)$ is divided into two parts whose sizes are proportional to the probabilities that the n'th BIT is zero or one. If BIT is zero, the new range $R(n)$ is $R(n-1)*P$ (the old range multiplied by the probability that BIT is zero) and the lower bound of the interval is not changed. If BIT is one, the lower bound of the new interval $F(n)$ is set to $F(n-1)+R(n-1)*P$, so that it lies above the interval assigned for the case where BIT is zero, and the new range $R(n)$ is set to $R(n-1)*(1-P)$ (the old range multiplied by the probability that BIT is one).

Figure 3:
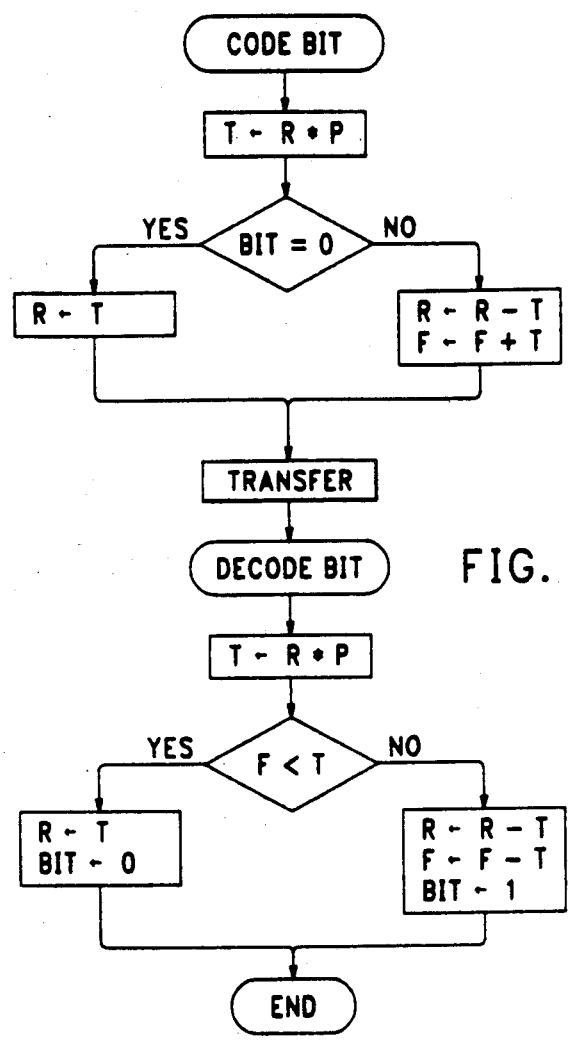
FIG. 3 is a system block diagram illustrative of the process to code and decode one bit.

FIG. 3 illustrates the coding and decoding of one BIT. This procedure and the descriptions of its implementation shown in FIGS. 5 and 6 use the following variables:

R: allowed range
F: (FIGS. 2,3 only)—all of the compressed data (all other FIGS.)—window of finite precision on the compressed data
P: probability that BIT is zero
T: temporary variable to save the calculation of SRL (R*P) 15
F1: temporary variable to save the calculation SRL F 1

The coding process first calculates and saves as T the value R*P (the size of the interval for the case where BIT is zero). BIT is then tested. If BIT is zero, the saved value becomes the new range, and the lower bound of the interval is unchanged. If BIT is one, the lower bound of the interval is increased by the saved value, and the range is reduced by the saved value (i.e. $R(n)$ is set to $R(n-1)-R(n-1)*P$, which is equivalent to $R(n-1)*(1-P)$). The decoding process also begins by calculating T as R*P. The coded value F (which represents the real number coded minus the lower bound of the current range) is then tested to see whether it is less than T. If so, then the BIT coded is zero, and the range is replaced by T. If F is not less than T, then the number represented by the code stream must fall into the interval where the value of BIT is one. The range is therefore reduced by T, as in the coder. The value of F must also be reduced by the size of the interval discarded, reversing the operation performed in the coder.

Figure 4:
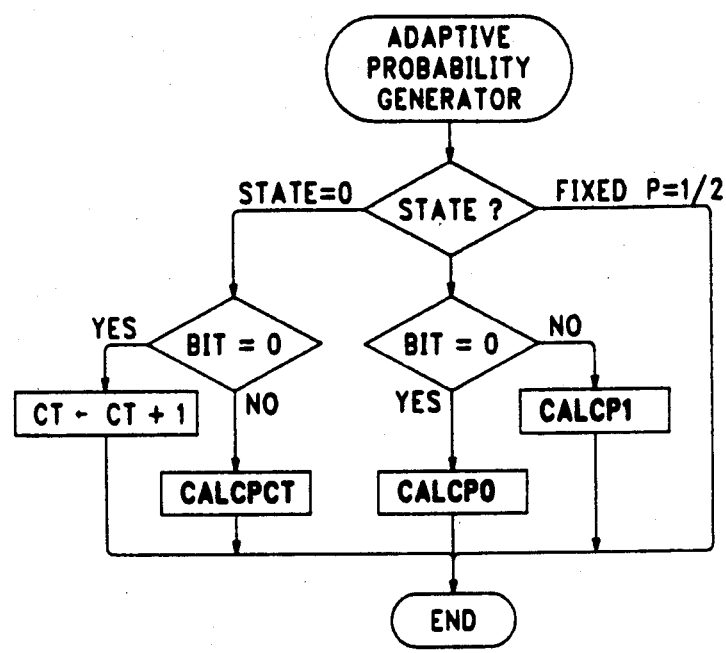
FIG. 4 is a flowchart of the adaptive probability generator, two of which are shown in the system of FIG. 1.

FIG. 4 describes an adaptive probability generator, two of which are shown in the system of FIG. 1. Its function is to take a STATE and a BIT, generate the probability that BIT is zero, and then examine BIT and use its value to adaptively update the probability information (statistics) on which it will base subsequent calculations. At the coder (FIG. 1) the STATE and BIT arrive at the adaptive probability generator simultaneously; at the decoder the STATE is used to generate P, which is used to decode the BIT, and the BIT is then sent to the adaptive probability generator for use in updating the statistics.

The adaptive probability generator may operate in any of three cases, depending on the state information. A zero value for STATE is recognized as a special case for which a count is kept of the number of times a zero value of BIT occurs. The statistics are not updated (and therefore the probability that BIT is zero does not change) until a one value for BIT is encountered; the updating operation performed at that time is described in more detail with reference to FIG. 9. The zero state is useful for processing an event which occurs many times in succession; since updating a counter is cheaper than the multiplication required to update the probability, the coder operates more rapidly.

Another special case is the state in which the probability that BIT is zero is fixed at 0.5. In this state no processing is required since no statistics need to be kept.

The third case generates probabilities from statistics which are updated after each event. The processes used to update the statistics and the probability P are described in more detail with reference to FIGS. 8 and 9.

Figure 5:
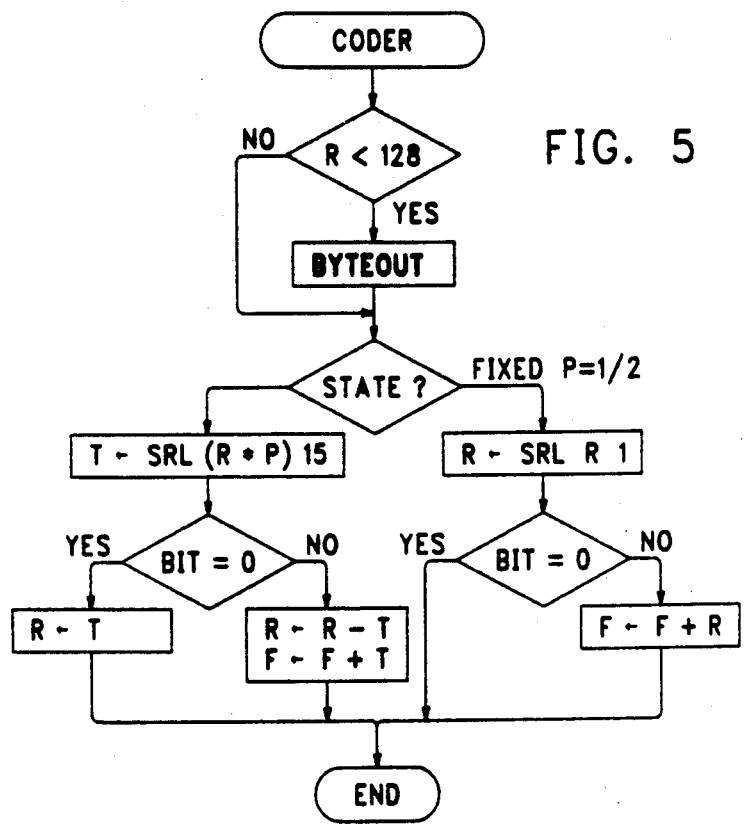
FIG. 5 is a flowchart of the coder.

FIG. 5 describes the coder. This unit accepts a STATE, a BIT, and a probability P that BIT is zero, and codes the BIT. The range R is first tested to see if it is less than a finite value, 128. If so, there may not be enough significant bits to code the product R*P accurately, so it is necessary to move a unit of output from F to the compressed data stream. The process BYTEOUT which performs this function increases the range to allow coding of more data. (BYTEOUT is described in more detail with reference to FIG. 10.)

The BIT is then coded. If the STATE indicates that the probability P is not fixed at 0.5, then the calculation described in the coder shown in FIG. 3 is performed. The temporary value T is calculated as the most significant part of the product of R*P. This value becomes the new range if BIT is zero; if BIT is one the range is reduced by T and F is increased by T. If the STATE indicates a probability fixed at 0.5, the multiplication may be replaced by a shift, and the new R will be the same for either value of BIT; it is necessary only to increase F if BIT is one.

Figure 6:
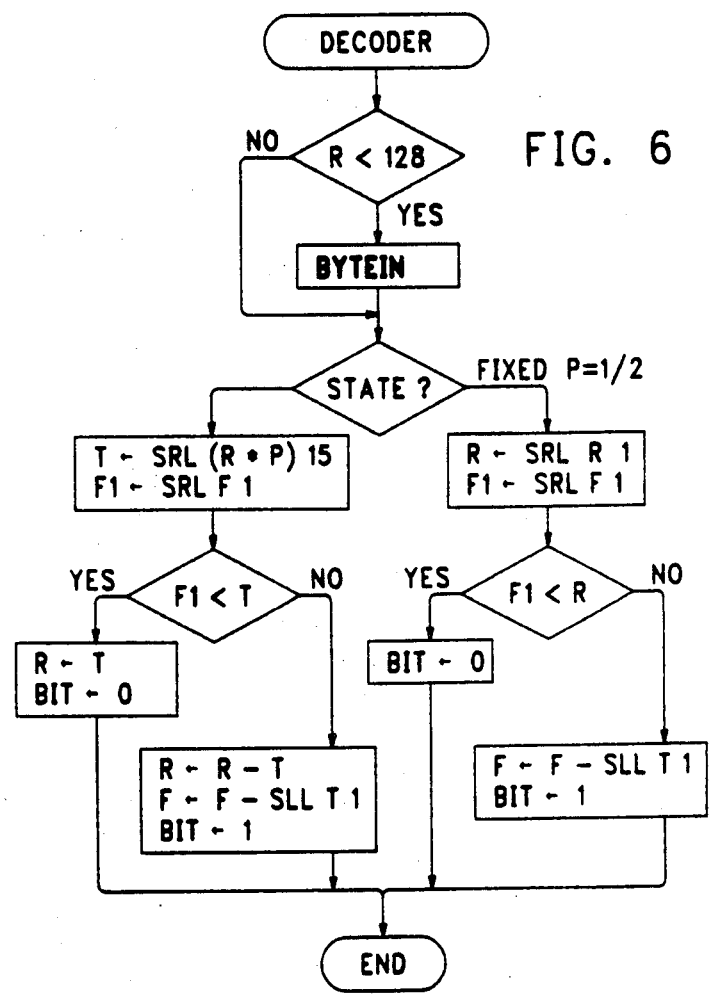
FIG. 6 is a flowchart of the decoder.

FIG. 6 describes the decoder. This unit accepts a STATE and a probability P that BIT is zero, and decodes the BIT. The range R is first tested to see if it is less than 128. If so, there may not be enough significant bits in the product R*P to decode correctly, so it is necessary to get a unit of data from the compressed data stream and add it to F. The process BYTEIN which performs this function increases the range to allow decoding of more data. (BYTEIN is described in more detail with reference to FIG. 11.)

The BIT is then decoded. If the STATE indicates that the probability P is not fixed at 0.5, then the calculation described in the decoder shown in FIG. 3 is performed. The temporary value T is calculated as the most significant part of the product of R*P. The low-order bit of F must not participate in the calculation in order to be symmetric with the coder, so a temporary value F1 is used which has the low-order bit shifted out. F1 is compared to T to determine whether BIT is zero or one. T becomes the new range if BIT is zero; if BIT is one the range is reduced by T and F is reduced by the value of T shifted left one bit. If the STATE indicates a probability fixed at 0.5, the multiplication may be replaced by a shift, and the new R will be the same for either value of BIT; again, the temporary value F1 is calculated and compared to T to determine the value of BIT, and F is decreased if BIT is one to discard the lower part of the original interval.

Figure 7:
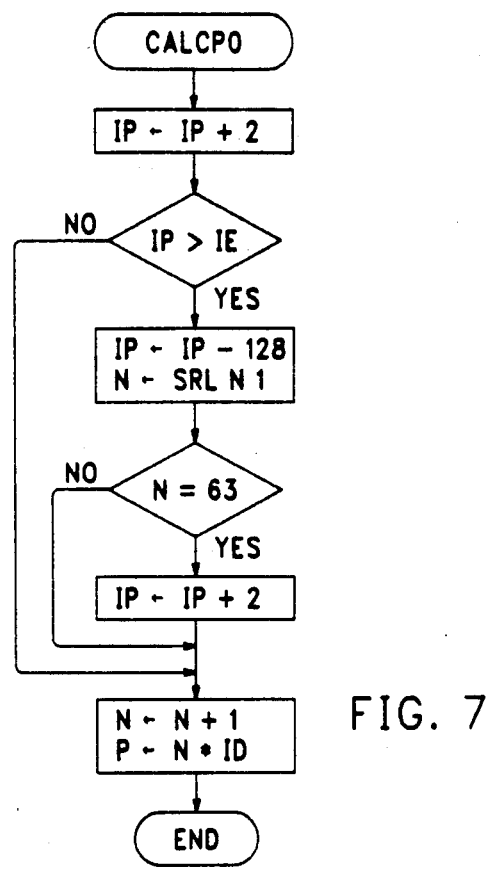
Figure 8:
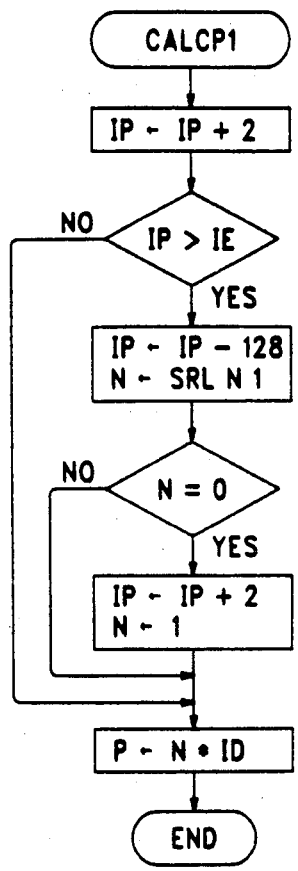
Figure 9:
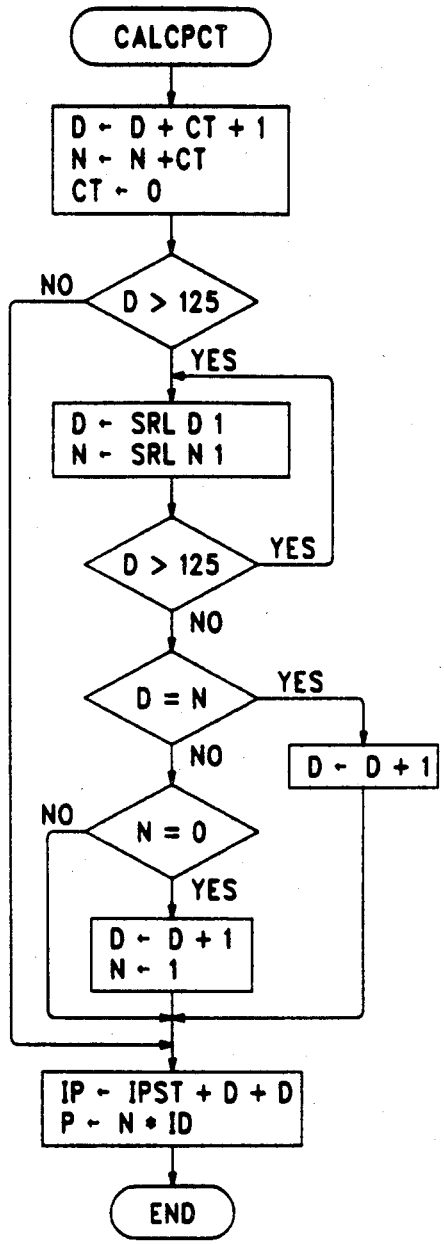

FIGS. 7 through 9 describe the procedures used in FIG. 4 to update statistics in the adaptive probability generator. Some variables used in these calculations will now be described.

Probabilities are obtained by deriving O=N/D, where:N=the number of times BIT=0 has occurred in the current state, and D=the total number of times the current state has occurred. Division is costly; the lookup table gives the inverse of the number of times a state has occurred. The table INVERT consists of 128 halfword (two-byte) entries; each entry is X'7FFF'/M where M is the number of the entry. If a state occurs more than 125 times, its statistics are renormalized to keep the number of occurrences of the state small enough to allow use of the table. The first table entry is for M−1 and will never be used. The complete INVERT table is:

| 0 | 32767 | 16383 | 10922 | 8191 | 6553 |
|---|---|---|---|---|---|
| 5461 | 4681 | 4095 | 3640 | 3276 | 2978 |
| 2730 | 2520 | 2340 | 2184 | 2047 | 1927 |
| 1820 | 1724 | 1638 | 1560 | 1489 | 1424 |
| 1365 | 1310 | 1260 | 1213 | 1170 | 1129 |
| 1092 | 1057 | 1023 | 992 | 963 | 936 |
| 910 | 885 | 862 | 840 | 819 | 799 |
| 780 | 762 | 744 | 728 | 712 | 697 |
| 682 | 668 | 655 | 642 | 630 | 618 |
| 606 | 595 | 585 | 574 | 564 | 555 |
| 546 | 537 | 528 | 520 | 511 | 504 |
| 496 | 489 | 481 | 474 | 468 | 461 |
| 455 | 448 | 442 | 436 | 431 | 425 |
| 420 | 414 | 409 | 404 | 399 | 394 |
| 390 | 385 | 381 | 376 | 372 | 368 |
| 364 | 360 | 356 | 352 | 348 | 344 |
| 341 | 337 | 334 | 330 | 327 | 324 |
| 321 | 318 | 315 | 312 | 309 | 306 |
| 303 | 300 | 297 | 295 | 292 | 289 |
| 267 | 284 | 282 | 280 | 277 | 275 |
| 273 | 270 | 268 | 266 | 264 | 262 |
| 260 | 258 | | | | |

Additional variables used to calculate probabilities and update statistics are:

D: the total count which would serve as the denominator
  for calculating P
N: the count of 0s which would serve as the numerator
  for calculating P
IP: pointer to the value in the INVERT table which represents the current value of D. Since INVERT is a halfword
  table, IP is incremented by 2 each time D is incremented by 1.
ID: the two-byte value pointed to by IP. It is X'7FFF'/2*D
IPST: address of the INVERT table
IE: last entry in the INVERT table (D=128).
CT: the number of 0s which have not yet been included in N and D FIG. 7 describes the CALCP0 process, which updates the statistics for a single coding step when BIT is zero. The number of occurrences of the current state is first increased by one by incrementing IP by two. A test is then performed to see if the end of the inversion table has been reached. If so, it is necessary to renormalize the statistics. The table pointer IP is set to point to the middle of the invention table, in effect halving D; the number of occurrences of BIT=0 (N) is then shifted right one bit. If this results in a value of 63 for N, then incrementing N would give N=D, so that the probability of BIT being zero would be calculated as one; to prevent this, IP is incremented by two to increase D. This completes the renormalization process. To calculate the new probability P, N is incremented by one to indicate an occurrence of BIT=0, and the new probability is calculated as N*ID (which is equivalent to N/D).

FIG. 8 describes the CALCP1 process, which updates the statistics for a single coding step when BIT is one. The number of occurrences of the current state is first increased by one by incrementing IP by two. A test is then performed to see if the end of the inversion table has been reached. If so, it is necessary to renormalize the statistics. The table pointer IP is set to point to the middle of the inversion table, in effect halving D; the number of occurrences of BIT=0 (N) is then shifted right one bit. If this results in a value of 0 for N, then the probability of BIT being zero would be calculated as zero; to prevent this, N and D are both increased by one (in the case of D, by incrementing IP by two). This completes the renormalization process. The new probability P is calculated as N*ID (which is equivalent to N/D).

Figure 10:
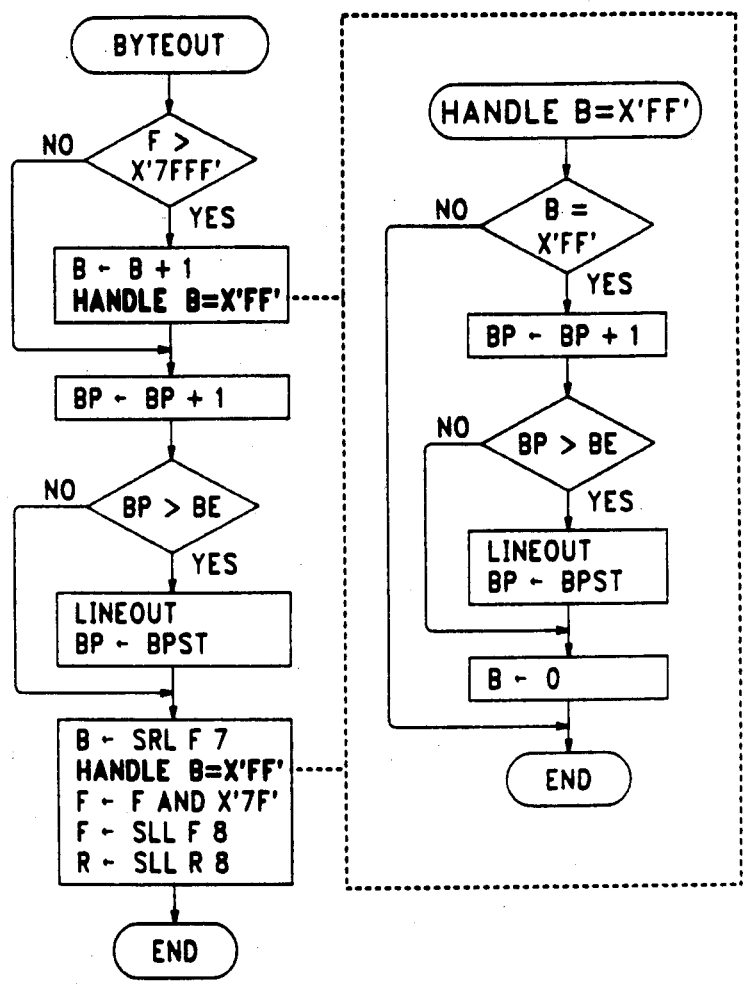
Figure 11:
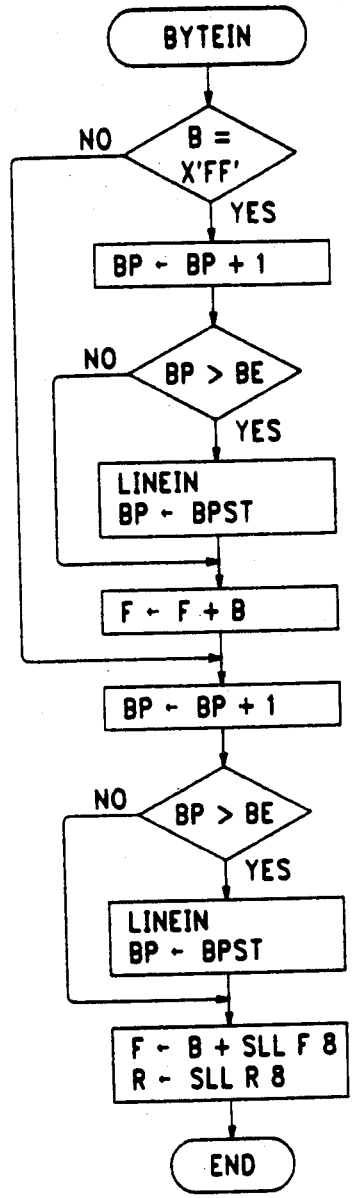

FIG. 9 describes the CALCPCT process, which updates the statistics for multiple coding steps when BIT is one. The count of the number of occurrences of the current state is first increased by CT+1, the number of zero BITs counted plus one for the BIT=1 to be coded. The number of occurrences of BIT=0 in the current state is increased by CT, and CT is reset to zero. A test is then performed to see if renormalization is necessary. If D is greater than 125, then both D and N are shifted right one bit. This process is repeated until D is no longer greater than 125. It is then necessary to ensure that the probability calculated from the quotient of N and D is neither zero nor one. If D and N are equal, D is incremented by one to prevent a calculation of P=1; otherwise, if N is zero, then both D and N are increased by one to prevent a calculation of P=0. This completes the renormalization process. IP is then set to 2*D bytes beyond the beginning of the INVERT table, and the new probability P is calculated as N*ID (which is equivalent to N/D). FIGS. 10 and 11 describe the procedures for dealing with the compressed data stream. The following variables are used:

BP: pointer to last byte of compressed data stored during coding
or used during decoding
B: byte pointed to by BP
BPST pointer to the first byte in the compressed data buffer.
BE pointer to the last byte in the compressed data buffer.
LEN length in bytes of the compressed data buffer
Note that $BE=BPST+LEN-1$.

FIG. 10 describes the BYTEOUT procedure indicated in FIG. 5. This procedure is called to add a unit of data from F to the compressed data stream and adjust F and R appropriately.

The first step is to test to see if there is a carry into the high-order bit of F (i.e. $F>X'7FFF'$ for 16 bit precision). If so, the unit previously placed in the compressed data stream is incremented by one for the carry. If the byte has been incremented to X'FF', additional processing (described below) is necessary.

After the carry bit (if any) has been provided for, BP is incremented to address the storage for the next byte of data. If the end of the compressed data buffer has been reached, the buffer is processed appropriately (transmitted, stored, etc.) by a procedure designated as LINEOUT, and BP is reset to point to the beginning of the buffer so that it can be filled with more data. The high-order eight bits of the 15-bit value F are then stored in the output buffer, with additional processing if the byte stored has the value X'FF'. The carry bit and the bits just stored are masked out of F, and the values of F and R are each shifted left eight bits to open up space to code more data.

It is necessary to ensure that no byte in the compressed data stream is "incremented" from X'FF' to X'00' by a carry into the most significant bit of F, since the carry out of the incremented byte cannot propagate. To prevent this form occurring, each byte stored is tested to determine if its value is X'FF'. If it is, an additional byte with the value X'00' is placed into the compressed data stream. This byte can be safely incremented if necessary. To place the zero byte into the compressed data stream, BP is incremented to address the space where the byte is to be stored; if the end of the compressed data buffer has been reached, LINEOUT is used to send out the completed buffer and BP is reset to the beginning of the buffer. The zero byte is then stored at BP.

FIG. 11 describes the BYTEIN procedure indicated in FIG. 6. This procedure is called to move a unit of data from the compressed data stream into F, adjusting F and R appropriately.

The first test checks to see whether the next byte in the compressed data stream was inserted following a X'FF' byte to allow space for a carry. If so (i.e. if B, the byte previously read, is X'FF'), then BP is incremented by one to address the next byte in the compressed data stream. If the end of the compressed data buffer has been reached, a procedure LINEIN is used to obtain more compressed data, and BP is reset to point to the beginning of the refilled buffer. The carry is then added to F.

After the carry bit (if any) has been added in, BP is incremented to address the next byte of compressed data. If the end of the compressed data buffer has been reached, LINEIN is used to obtain more data, and BP is reset to point to the beginning of the buffer. F is then shifted left eight bits and the new byte of compressed data is inserted as the low-order eight bits of F; R is also shifted left eight bits.

FIG. 12 shows the initializations required for the encoder and decoder.

For the state 0 statistics, the number of times BIT=0 has been encountered is set to zero, the probability P that BIT=0 is initialized to ⅞ (with N=7 and D=8), and IP is set to correspond to D.

For the nonzero states without fixed probabilities of 0.5, the probability P that BIT=0 is initially set to ½, with N=1 and IP=IPST+4 (effectively, D=2).

Additional variables which must be set up include the addresses of the beginning and end of the INVERT table; the addresses of the beginning and end of the compressed data buffer; and the value of BP, which points to a byte before the first read byte. In the encoder, a carry can not occur for the first byte, so this data will not be modified. In the decoder, care must be taken that the byte before the real buffer is not accidentally X'FF'. For the encoder, F is set to zero; for the decoder, BYTEIN is called twice to load two bytes into F as its initial value. In either case the range R is initialized to X'7FFF', which represents 1.

FIG. 13 shows the procedure used in the encoder to add the final bytes to the compressed data stream. This is useful to guarantee that the decoder will have enough data. F is first incremented by R/2 (calculated as SRL R 1) to place it in the middle of the current range, and a byte is put out. BP is then incremented by one to address the space for the next byte; if the end of the compressed data buffer has been reached, LINEOUT is called to process the buffer and BP is reset. A byte with the value X'FE' is then placed in the output buffer. (The choice of the value X'FE' is arbitrary; any value except X'FF' could be used.) BP is incremented again and compared to the address of the end of the compressed data buffer, and LINEOUT is called and BP reset if necessary; then another byte with value X'FE' is placed in the compressed data stream. The compressed data stream is now complete, and LINEOUT is called to process the final buffer.

Below is a brief table indicating some of the initialization adjustments which can be made to operate with 32 bit precision instead of 16 bit precision.

|  | Theory | Precision 16 bit | 32 bit |
|---|---|---|---|
| F | 0 | 0 | 0 |
| R | 1=100% | (215)−1=X'7FFF' | (231)−1=X'7FFFFFFF' |
| INVERT(I) | 1/I | X'7FFF'/I | X'7FFFFFFF'/I |

Thus, while the invention has been described with reference to a preferred embodiment in the form of a programming system for a source computer and a destination computer connected via a storage or communications transfer means, it will be understood by those skilled in the art that various changes in form and details, such as an all-hardware implementation, may be made without departing from the scope of the invention. For example, operation is by byte as the data group, although larger data groups are appropriate for larger systems.

What is claimed is:

1. A data compression/transfer/decompression system operating to transfer a stream of data, which may be designated n=1, 2 ... N−1, N and repeating n=1, 2 ... N−1, N, compressed according to a selected data compression model, characterized by
   (a) data input means;
   (b) first state generator means (b), connected to said data input means (a), for providing a binary decision bit signal for binary decision n, and a state signal, which may be a multi-bit signal, for binary decision n;
   (c) first adaptive probability generator means, connected to said state generator means (b), responsive to a previously developed statistic value developed during binary decisions 1 ... (n−1), to state signal n and to bit signal n to provide an updated probability statistic for use in decisions subsequent to binary decision n, and to provide probability signal n as output;
   (d) coder means, connected to said first state generator means (b) and to said first adaptive probability generator means (c), responsive to state signal n and binary decision bit signal n provided by said first adaptive probability generator means (c), to generate a compressed data group for transfer;
   (e) transfer means connected to said coder means;
   (f) decoder means, connected to said transfer means (e), to second state generator means (h) and to second adaptive probability generator means (i), responsive to a compressed data transfer signal group, to destination state signal n and to destination adaptive probability signal n to provide decompressed signals for binary decision n;
   (g) output means, for providing at the destination a data stream of decompressed data corresponding to the data stream at said input means,;
   (h) second state generator means, connected to said output means (g), to said decoder means (f) and to second adaptive probability generator means (i), providing for binary decision n, a destination state signal n, which may be a multi-bit signal, and responsive to said decoder output destination bit signal n to provide output data to said output means (g);
   (i) second adaptive probability generator means, connected to said second state generator means (h) and to said decoder means (f), responsive to said destination bit signal and to said destination state n to provide an updated probability statistic for use in decisions subsequent to binary decision n, and to provide probability signal n as output.

2. A data compression/transfer/decompression system operating to transfer data, in compressed form according to a selected data compression model, according to claim 1 further characterized in that
   said first and second adaptive probability generator means comprise means to detect a special probability case for which prediction smoothness permits a prediction mode inference to be made prior to inclusion in the probability, for a sequence of binary decisions without probability update between decisions,
   means to count binary decisions which have not yet been included in the probability,
   means to detect a termination criterion for the special probability case, and
   and means, responsive to said means to count binary decisions, and responsive to said means to detect a termination criterion, to update probability.

3. A data compression/transfer/decompression system operating to transfer data, compressed according to a selected data compression model, according to claim 1 further characterized in that
   said first adaptive probability generator means (c) comprises means to shift binary data one position to accomplish the equivalent of multiplication by 2,
   and said second adaptive probability generator (i) comprises means to shift binary data one position to accomplish the equivalent of multiplication by 2.

4. A data compression/transfer/decompression system operating to transfer data, compressed according to a selected data compression model, according to claim 1 further characterized in that there is a window of finite precision of the compressed data group for transfer, having a high order bit position means to test for high order carry each compressed data group for transfer,
   said coder means (d) comprises means responsive to said means to test for high order carry to insert a zero byte and
   said decoder means (f) comprises means responsive to said means to test for high order carry to determine existence of a carry into the high order bit position of the window of finite precision of the compressed data group for transfer to ensure proper handling of a carry to insert a zero byte.

5. A data compression/transfer/decompression system operating to transfer data, compressed according to a selected data compression model, according to claim 1 further characterized in that there is a real number which describes events previously coded, lying within a definable range R, and said coder means (d) and said decoder means (f) comprise means to change the range in multiple-bit data group units; and means to test the range (R) for a finite value of significant bits and upon detection of an undervalue situation to change range R by another unit of compressed data stream data.

6. A data compression/transfer/decompression system operating to transfer data, compressed according to a model, according to claim 1 further characterized in that said first adaptive probability generator means (c) and said second adaptive probability generator means (i) each comprise means to derive $P=N/D$, where: $1>P>0$, N=the numerator=the number of times the binary decision bit zero value (BIT=0) has occurred in the current state, and D=the denominator=total number of times the current state has occurred.

7. A data compression/transfer/decompression system operating to transfer data, compressed according to a model, according to claim 6 further characterized in that said means to derive $P=N/D$ comprises means to perform table lookup from an inversion table having a limited number of table addresses.

8. A data compression/transfer/decompression system operating to transfer data, compressed according to a model, over time or distance, according to claim 7 further characterized by said means to derive $P=N/D$ comprises means to normalize the table lookup by shifting both D and N, testing against a maximum value less than the number of table addresses of said inversion table, and shifting iteratively until $D \leq$ said maximum value, testing D and N for equality and incrementing D upon equality to prevent $P=1$, otherwise testing N for zero value and upon ascertaining $N=0$, incrementing both N and D to prevent $P=0$.

9. A data compression/transfer/decompression system operating to transfer data, compressed according to a model, over time or distance, according to claim 1 further characterized in that said first adaptive probability generator means (c) and said second adaptive probability generator means (i) each comprise CALCP0 means, said CALCP0 means comprising a table pointer (IP), a finite inversion table, having high and low ends and means for updating the statistics for a single coding step when the current binary decision bit is zero, by incrementing said table pointer by two, testing against said inversion table to determine if the high end of said inversion table has been reached, and if reached, renormalizing the statistics by initiating a one bit shift right.

10. A data compression/transfer/decompression system operating to transfer data, compressed according to a model, over time or distance, according to claim 1 further characterized in that said first adaptive probability generator means (c) and said second adaptive probability generator means (i) each comprise CALCP1 means, said CALCP1 means comprising a table pointer (IP), a finite inversion table having high and low ends and means for updating the statistics for a single coding step when the current binary decision bit is one, by incrementing said table pointer by two, testing against said inversion table to determine if the high end of said inversion table has been reached, and if reached, renormalizing the statistics by initiating a one bit shift right.

11. A data compression/transfer/decompression system operating to transfer data, compressed according to a model, over time or distance, according to claim 1 further characterized in that said first adaptive probability generator means (c) and said second adaptive probability generator means (i) each comprise CALCPCT means, said CALCPCT means comprising means for developing total counts as the denominator (D) and numerator (N), a table pointer (IP), a finite inversion table having high and low ends and means for updating the statistics for multiple coding steps when the current binary decision bit is one, by testing (D) against a finite number to determine if renormalization is necessary, and if greater than the finite number, renormalizing the statistics by iteratively initiating a one bit shift right for denominator (D) count and for numerator (N) count and testing (D), and incrementing where necessary to prevent a probability calculation of either 0 or 1.

12. A data compression/transfer/decompression system operating to transfer data, compressed according to a model, over time or distance, according to claim 1 further described in that said coder means (d) comprises BYTEOUT means to add a unit of data from the window of finite precision (F) to the compressed data stream.

13. A data compression/transfer/decompression system operating to transfer data, compressed according to a model, over time or distance, according to claim 1 further characterized in that said decoder means (f) comprises BYTEIN means to move a unit of data from the compressed data stream into the window of finite precision (F).

14. A data compression/transfer/decompression system operating to transfer data, compressed according to a model, over time or distance, according to claim 1 further characterized by initialization means to initialize said coder means (d) to zero and to set said decoder means (f) to an initial value.

15. A data compression/transfer/decompression system operating to transfer data, compressed according to a model, over time or distance, according to claim 1 further characterized by means to add final bytes to the compressed data stream.

16. A data compression/transfer/decompression system operating to transfer data, compressed according to a model, according to claim 1 further characterized in that said first adaptive probability generator means and said second adaptive probability generator means each comprise means to calculate by table lookup the inverse of the number of decisions in which BIT=0 has occurred together with a constant state signal, divided by the total number of times the current state signal has occurred, renormalized at a finite number of occurrences.

17. A data compression/transfer/decompression method operating to transfer data, compressed according to a selected data compression model, from source to destination, comprising the following steps:

(a) providing at the source a multi-bit group of input data;
(b) generating at the source a binary decision BIT signal, and a STATE signal, which may be a multi-bit signal;
(c) generating a first adaptive PROBABILITY value related to the value at the source of the STATE signal and the value at the source of the BIT signal;
(d) coding the STATE signal and the BIT signal for each binary decision, together with the PROBABILITY value to generate a compressed data group for transfer;
(e) transferring said compressed data group;
(f) decoding said transferred compressed data group in response to transferred compressed data group values and to destination STATE signal and destination PROBABILITY to provide a decompressed BIT value for binary decision n;
(g) providing as output at the destination a data stream of decompressed data corresponding to the data stream of binary decisions of the input data, which may be designate $n = 1, 2 \ldots N-1, N$ and repeating $n = 1, 2 \ldots N-1, N$;
(h) generating at the destination a second STATE signal, providing for the binary decision a destination STATE signal, which may be a multi-bit signal, and responsive to the destination BIT signal to provide output data; and
(i) generating at the destination a second adaptive PROBABILITY responsive to the destination BIT signal and to the destination STATE signal and modified for history of binary decisions $1 \ldots n$.

* * * * *